(12) United States Patent
Ehrenreich et al.

(10) Patent No.: US 8,363,487 B2
(45) Date of Patent: Jan. 29, 2013

(54) METHOD, SYSTEM, COMPUTER PROGRAM PRODUCT, AND DATA PROCESSING DEVICE FOR MONITORING MEMORY CIRCUITS AND CORRESPONDING INTEGRATED CIRCUIT

(75) Inventors: Sebastian Ehrenreich, Boeblingen (DE); Tilman Gloekler, Boeblingen (DE); Willm Hinrichs, Boeblingen (DE); Jens Kuenzer, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 12/784,164

(22) Filed: May 20, 2010

(65) Prior Publication Data

US 2010/0309734 A1   Dec. 9, 2010

(51) Int. Cl.
*G11C 16/04* (2006.01)
(52) U.S. Cl. .................... 365/189.07; 365/200; 365/201
(58) Field of Classification Search ............. 365/189.07, 365/200, 201, 207, 49.17
See application file for complete search history.

(56) References Cited

U.S. PATENT DOCUMENTS 7,864,565 B2 * 1/2011 Nirschl et al. ........... 365/189.07
2010/0182857 A1 * 7/2010 Arai et al. ..................... 365/193

OTHER PUBLICATIONS

Mojumder et al., Design and Analysis of a Self-Repairing SRAM with On-Chip Monitor and Compensation Circuitry, IEEE, 2008, pp. 101-106, 26th Annual IEEE VLSI Test Symposium.

* cited by examiner

*Primary Examiner* — David Lam
(74) *Attorney, Agent, or Firm* — Yudell Isidore Ng Russell PLLC

(57) ABSTRACT

An improved method monitors memory circuits, especially those used in integrated circuits. The method provides: writing random data in at least one monitor cell, which is implemented as a regular memory cell with an artificially deteriorated stability in order to provoke early fails when compared to fails in a regular memory cell; reading the random data out of the at least one monitor cell; comparing the output data of the read operation against an expected value to detect a value mismatch; and reporting the value mismatch to an error structure if the value mismatch is detected.

23 Claims, 4 Drawing Sheets

METHOD, SYSTEM, COMPUTER PROGRAM PRODUCT, AND DATA PROCESSING DEVICE FOR MONITORING MEMORY CIRCUITS AND CORRESPONDING INTEGRATED CIRCUIT

PRIORITY CLAIM

The present application claims benefit of priority under 35 USC §120, §365 to the previously filed German Patent Application No. 09161933.8 entitled, "Method, Arrangement, Computer Program Product, and Data Processing Program for Monitoring Memory Circuits and Corresponding Integrated Circuit" with a priority date of Jun. 4, 2009, which is incorporated by reference herein.

BACKGROUND OF THE INVENTION

1. Field of the Invention

The present invention relates in general to the field of monitoring memory circuits used in integrated circuits, and in particular to a method and system for monitoring memory circuits and a corresponding integrated circuit designed with monitoring memory circuits. The present invention also relates to a data processing program and a computer program product for monitoring memory circuits that comprise a multiple of memory cells.

2. Description of the Related Art

Random variations in the characteristics and operating conditions of static random access memory (SRAM) or in dynamic random access memory (DRAM) can result in read and write failure in these devices. In particular, state-of-the-art deep sub-micron very large scale integration (VLSI) technology suffers from a significant amount of silicon aging problems that lead to reliability problems for embedded SRAM or DRAM memory cells. While it is well-known how to test and characterize these memory cells in the lab, it is getting more and more critical to make sure that these memories continue to work correctly in the field under various operating conditions like voltage and temperature. In order to compensate aging effects and to prevent early failure of a device in the field, the legal operating conditions have to be specified in a very conservative manner; however, large safety margins when characterizing the devices reduce the yield. Also, with respect to the voltage, these aging effects result in higher than strictly required voltage requirements, causing even faster aging during the lifetime of the chip.

In the Institute for Electronics and Electrical Engineers (IEEE) paper "Design and Analysis of a Self-Repairing SRAM with On-Chip Monitor and Compensation Circuitry" by Nildadri Narayan Mojumder et al, 26th IEEE VLSI Test Symposium, 2008, Apr. 27, 2008-May 1, 2008, Pages 101-106, on-chip monitors are disclosed which directly sense the global read stability and writability of the cell. However, in this publication the structure of the cells themselves, used as on-chip monitors, is modified to measure circuit parameters, which makes it very difficult to determine the characteristics and/or the specifications and/or the behavior of regular memory cells used in the memory circuit to be monitored.

SUMMARY OF THE INVENTION

The invention provides a method and a system configuration for monitoring memory circuits, which are able to detect stability problems in memory cells before the problems result in real application errors that potentially cause system outages. The invention also provides an integrated circuit comprising a specific structural arrangement of monitoring memory circuits, and a data processing program and a computer program product to perform the method for monitoring memory circuits.

According to the invention this problem is solved by providing specific features recited within the claims appended hereto, including a method for monitoring memory circuits, a system and an integrated circuit having a specific structural arrangement for monitoring memory circuits, a data processing program for performing the method for monitoring memory circuits, and a computer program product causing a computer to perform the method for monitoring memory circuits. Advantageous embodiments of the invention are mentioned in the dependent claims.

Accordingly, in an embodiment of the present invention a method for monitoring memory circuits used in integrated circuits comprises: writing random data in at least one monitor cell, which is implemented as regular memory cell with an artificially deteriorated stability, in order to provoke early fails compared to a regular memory cell; reading the random data out of the at least one monitor cell; comparing output data of the read operation against an expected value to detect a value mismatch; and reporting the value mismatch to an error structure if the value mismatch is detected.

In further embodiments of the present invention, the stability of a first monitor cell is deteriorated by using a reduced supply voltage compared to the supply voltage of the regular memory cells.

In further embodiments of the present invention, the stability of a second monitor cell is deteriorated by using a higher wordline voltage swing compared to the wordline voltage swing of the regular memory cells, to increase stress on the monitor cell.

In further embodiments of the present invention, the stability of a third monitor cell is deteriorated by using a lower wordline voltage swing compared to the wordline voltage swing of the regular memory cells.

In further embodiments of the present invention, the stability of a fourth monitor cell is deteriorated by increasing a low level of the wordline voltage compared to the low level of the wordline voltage of the regular memory cells.

In further embodiments of the present invention, the stability of a fifth monitor cell is deteriorated by using control signals with deteriorated timing parameters compared to the timing parameters of control signals using with the regular memory cells.

In further embodiments of the present invention, random data is periodically written in the monitor cells and periodically read out from the monitor cells, and the output data of the read operation is compared periodically against corresponding expected values to detect value mismatches.

In further embodiments of the present invention, a pre-established number of the monitor cells are used to monitor the memory circuit.

In further embodiments of the present invention, an error reporting structure and/or a memory controller/operating system takes appropriate action to increase the stability of the memory cells of the memory circuit.

In further embodiments of the present invention, at least one operating condition of the memory circuit is changed to increase the memory cells stability as a consequence of a detected value mismatch in at least one artificially deteriorated monitor cell. In further embodiments of the present invention, the at least one operating condition comprises one or more of an operating voltage, an operating temperature, a refresh rate, and timing parameters.

In another embodiment of the present invention, a system for monitoring memory circuits used in integrated circuits comprises multiple memory cells and a monitor circuit, wherein at least one monitor cell is implemented as a regular memory cell with an additional deterioration circuit. The deterioration circuit artificially deteriorates the stability of the regular memory cell of the at least one monitor cell, compared to the rate of deterioration of a regular memory cell, in order to provoke early fails.

In further embodiments of the present invention, the deterioration circuit is adapted to reduce a supply voltage of the memory cell, which is part of the at least one monitor cell, compared to the supply voltage provided to the regular memory cell.

In further embodiments of the present invention, the deterioration circuit is adapted to generate a higher wordline voltage swing for the memory cell, which is part of the at least one monitor cell, compared to the wordline voltage swing for the regular memory cell, to increase stress on said memory cell.

In further embodiments of the present invention, the deterioration circuit is adapted to generate a lower wordline voltage swing for the memory cell, which is part of the at least one monitor cell, compared to wordline voltage swing of the regular memory cells.

In further embodiments of the present invention, the deterioration circuit is adapted to increase a low level of said wordline voltage for the memory cell, which is part of the at least one monitor cell, compared to the low level of said wordline voltage of the regular memory cell.

In further embodiments of the present invention, the deterioration circuit is adapted to generate control signals with deteriorated timing parameters for the memory cell, which is part of the at least one monitor cell, compared to the regular memory cell.

In further embodiments of the present invention, the monitor circuit generates random data which is periodically written in the monitor cells and read out from the monitor cells, and the monitor circuit compares the output data of the read operation against the expected value to detect a value mismatch.

In further embodiments of the present invention, the monitor circuit reports the value mismatch to the error structure and/or a memory controller/operating system.

In further embodiments of the present invention, the error structure and/or the memory controller/operating system change at least one operating condition of the memory circuit to increase the stability of the memory cells, as a consequence of a detected value mismatch in at least one artificially deteriorated memory cell, which is part of the at least one monitor cell.

In further embodiments of the present invention, the at least one operating condition comprises one or more of an operating voltage, an operating temperature, a refresh rate, and timing parameters.

In another embodiment of the present invention, an integrated circuit comprises multiple memory cells, a monitor circuit, and at least one structural arrangement/configuration of monitoring memory circuits.

In further embodiments of the present invention, the multiple memory cells are part of an embedded memory circuit used in a microprocessor and/or an application specific IC (ASIC).

In further embodiments of the present invention, the multiple memory cells are part of a Dynamic Random Access Memory (DRAM) and/or Static RAM (SRAM) chip.

In further embodiments of the present invention, the DRAM and/or SRAM chip are used as main memory in a computer system.

In another embodiment of the present invention, a data processing program for execution in a data processing system comprises software code portions for performing a method for monitoring memory circuits when the program is run on the data processing system.

In yet another embodiment of the present invention, a computer program product stored on a computer-usable medium comprises computer-readable program means for causing a computer to perform a method for monitoring memory circuits when the program is run on the computer.

Embodiments of the invention disclosed herein detect stability problems in memory cells before they result in data corruption that would require corrective action of an error correcting circuit (ECC) or potentially cause system outages, if the ECC fails to correct the error. The embodiments of the invention solve the problem of how to ensure that the memory cells operate with enough stability margins while operating with various different environmental parameters like voltage, frequency, temperature, and aging effects. Finally, embodiments of this invention can also be used to implement circuits that are self-calibrating and that can on-the-fly adjust memory circuit parameters like the DRAM-refresh rate or even the supply voltage or the operating temperatures, in order to increase the stability of the memory cells, used in the memory circuit.

A small number of special monitor cells is implemented using regular memory cells and the deterioration circuit together with a monitor circuit. For example, the relation of regular memory cells and monitor cells in a memory circuit may range from 100:1 to 100,000:1. These monitor cells are used to detect fails only and are not used to store mission-critical user data. The stability of these monitor cells is artificially deteriorated compared to the regular memory cells in order to provoke early fails. This can be done by lowering their supply voltage with an additional stacked transistor or other means. When the operating conditions of a chip are gradually deteriorated a fail will be detected in the monitor cells. The regular memory cells that are storing mission critical data are still functional but with a smaller than desired error margin. This situation is detected by the monitor circuit that periodically writes and reads out random data, e.g. alternating between logical signals with low level and high level, and detects malfunctions of the monitor cells. If a malfunction is detected, an appropriate action can be taken such as increasing the refresh rate of an embedded memory circuit or changing other operating conditions i.e. voltage, read/write timing, operation temperature etc. for the memory circuit.

These actions decrease the error probability in the embedded memory circuit and lower the risk of chip failures in the field for applications that require a high reliability and/or a high availability.

The above, as well as additional purposes, features, and advantages of the present invention will become apparent in the following detailed written description.

BRIEF DESCRIPTION OF THE DRAWINGS

An illustrative embodiment of the invention, as described in detail below, is shown in the drawings, in which.

DETAILED DESCRIPTION OF THE PREFERRED EMBODIMENTS

Figure 1:
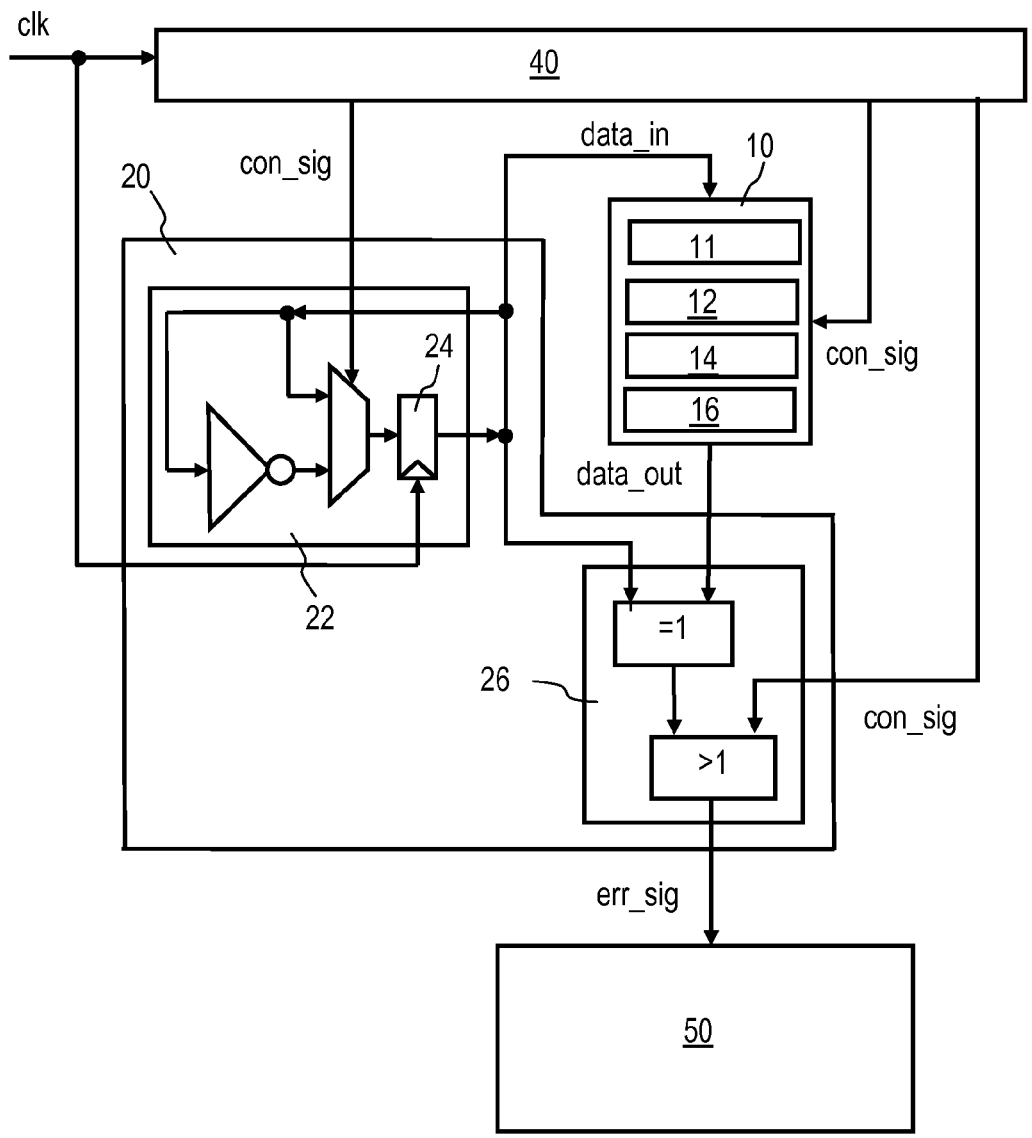
FIG. 1 is a schematic block diagram of an arrangement for monitoring memory circuits, in accordance with an embodiment of the present invention.
Figure 2:
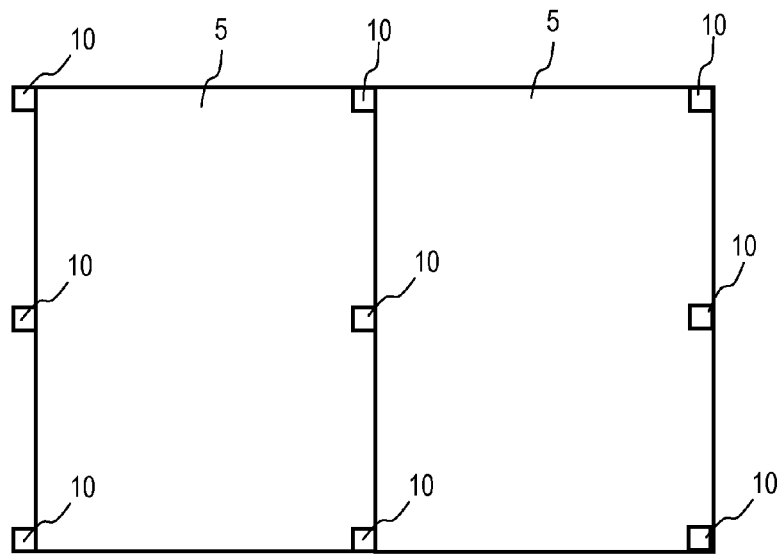
FIG. 2 is a schematic floor plan of memory areas to be monitored.

FIG. 1 is a schematic block diagram of an arrangement for monitoring memory circuits, in accordance with an embodiment of the present invention, and FIG. 2 is a schematic floor plan of memory areas 5 to be monitored.

Referring to FIG. 1, the shown embodiment of the invention employs an arrangement for monitoring memory circuits shown as memory areas 5 in FIG. 2, especially used in integrated circuits, comprising a multiple of regular memory cells (not shown), at least one monitor cell 10, and a monitor circuit 20. According to the invention, the at least one monitor cell 10 is implemented as a regular memory cell 14 with an additional deterioration circuit 12. The at least one monitor cell 10 is used to detect fails, and the deterioration circuit 12 artificially deteriorates the stability of the regular memory cell 14, which is part of the at least one monitor cell 10, when compared to the stability of a regular memory cell, in order to provoke early fails. In the embodiment, shown in FIG. 1, the monitor cell 10 additionally comprises a wordline driving circuit 11 and a sense amplifier 16. The monitor circuit 20 comprises a logical signal generation circuit 22 to write logical data in the monitor cell 10, wherein the logical signal generation circuit 22 comprises a latch 24 that drives alternating logic high level (1) and logic low level (0) values as data input data_in for the monitor cell 10. The sense amplifier 16 is used for reading the data of the monitor cell 10. After reading out the data value data_out from the monitor cell 10, the output data data_out of the read operation is compared with an expected value using a logical comparator circuit 26. The logical comparator circuit 26 of the monitor circuit 20 reports a detected mismatch as error signal err_sig to an error structure 50. In the shown embodiment a simple state machine is used as memory controller/operating system 40 that controls the update of the latch 24, the reading and writing of the monitor cell 10, and the point in time for the comparison done by the logical comparator circuit 26.

Referring to FIG. 2, the monitor cell 10 is placed next to normal memory arrays 5, which are representing memory circuits, for example. In order to take process variation on a chip into consideration and if the memory arrays 5 are very large, several instances of the monitor circuits 20 and monitor cells 10 might be needed. In the shown embodiment the monitor cells 10 are placed at the corners and in the middle of the memory arrays 5. Other placements are possible, e.g. the monitor cell 10 could be evenly spread all over the chip to also catch on-die-process variation problems.

In order to avoid yield problems in case of manufacturing defects in the monitor cells 10 themselves, only "good" monitor cells 10 should be enabled for monitoring in a real system. This can be easily achieved by connecting the error output of the monitor cells 10 to the error reporting structure 50 (local fault isolation registers—LFIR) of the chip and mask off defect monitor cells.

If special array deterioration effects are supposed to be modeled by the monitor cell 10, one single monitor cell 10 is not sufficient and, for example, one evaluation circuit together with the typical amount of monitor cells 10 connected to it needs to be implemented. This helps to extend the coverage to all critical circuits, also ensuring same loading and stress conditions to the involved circuits.

Figure 3:
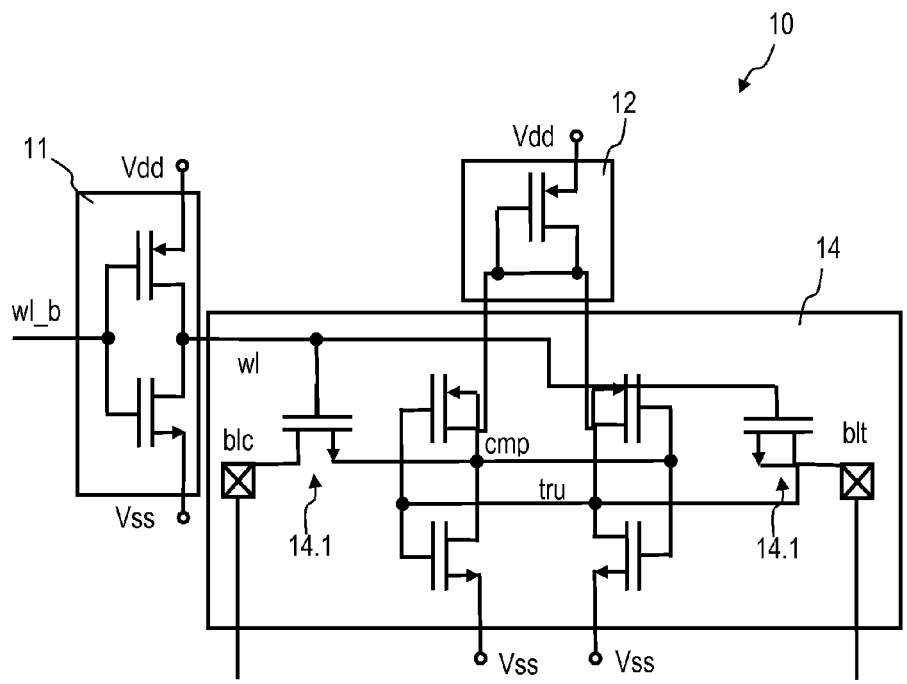
FIG. 3 is a schematic circuit diagram of a first embodiment of a monitor cell used in the arrangement shown in FIG. 1.
Figure 4:
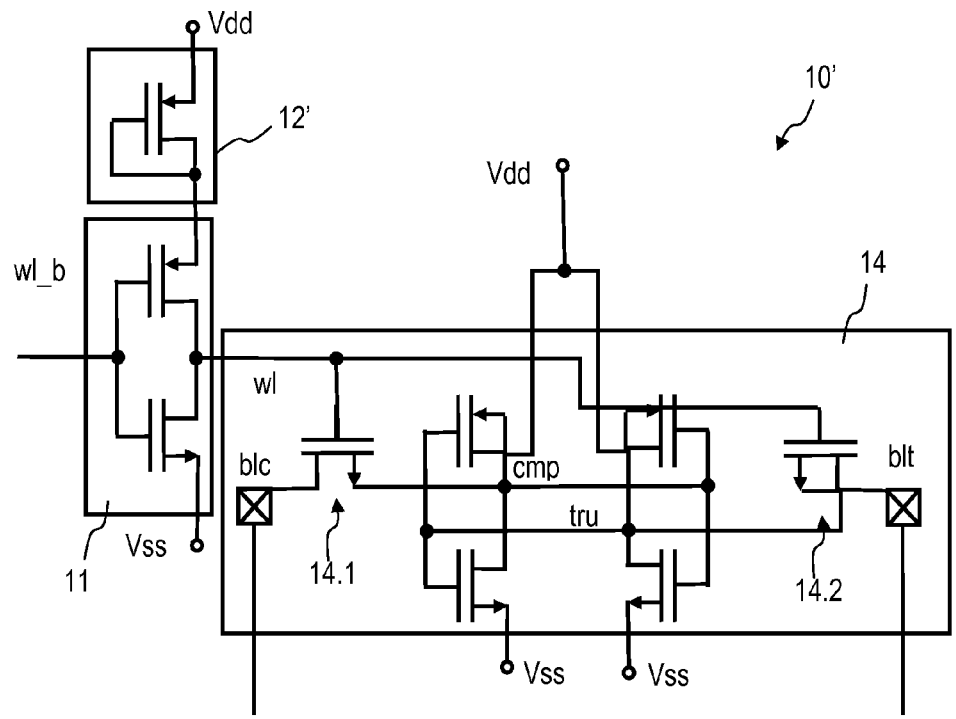
FIG. 4 is a schematic circuit diagram of a second embodiment of a monitor cell used in the arrangement shown in FIG. 1.
Figure 5:
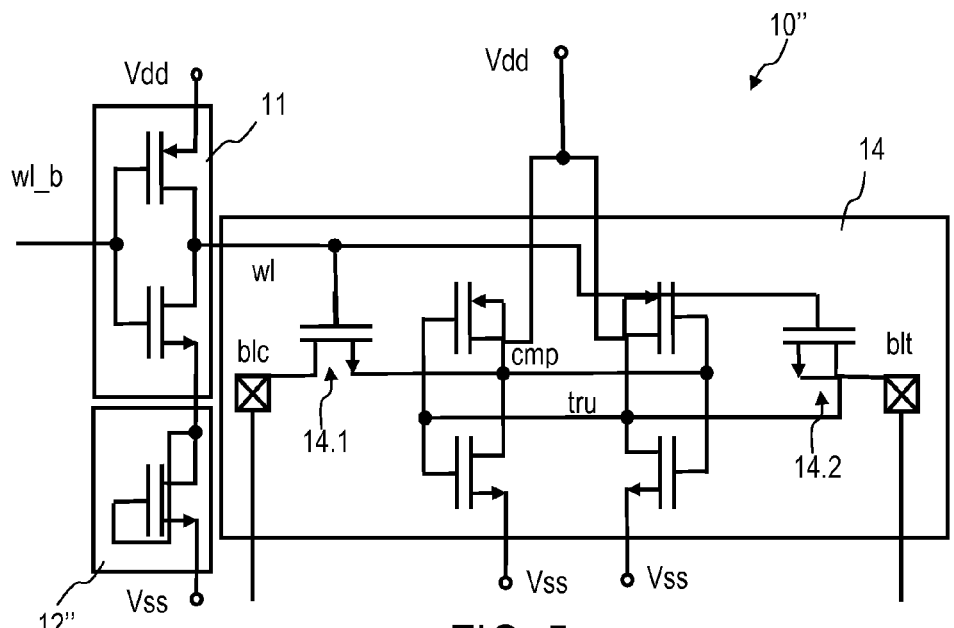
FIG. 5 is a schematic circuit diagram of a third embodiment of a monitor cell used in the arrangement shown in FIG. 1.

FIG. 3 is a schematic circuit diagram of a first embodiment of a monitor cell 10 used in the arrangement shown in FIG. 1; FIG. 4 is a schematic circuit diagram of a second embodiment of a monitor cell 10' used in the arrangement shown in FIG. 1; and FIG. 5 is a schematic circuit diagram of a third embodiment of a monitor cell 10" used in the arrangement shown in FIG. 1.

The monitor cell 10, 10', and 10" with the deterioration circuit 12, 12', and 12" and the memory cell 14 can be designed as follows, using SRAM cells as example. It is not only a single monitor cell 10, 10', and 10" but also a combination of the following monitor cells 10, 10', and 10" that can be used in a real device, resulting in an improved sensitivity of the monitoring circuit 20.

Referring to FIG. 3, the monitor cell 10 consists of a six transistor SRAM cell 14 as used for the memory arrays 5 on the chip. The unchanged cell design guarantees a good tracking between "real" array memory cells and memory cell 14 of the monitor cell 10. The stability of the monitor cell 10 is deteriorated by a first deterioration circuit 12 formed as diode connected pFET device, for example. This deterioration circuit 12 reduces a first SRAM cell supply voltage Vdd by approximately one pFet threshold voltage Vthp, i.e. the effective supply voltage for the memory cell 14 is Vdd-Vthp. Due to the reduced supply voltage, the memory cell 14 of the monitor cell 10 is less stable compared to a regular array SRAM cell. Alternatively a second supply voltage Vss may be reduced by using a deterioration circuit (not shown).

In addition to the reduction of the supply voltage Vdd or Vss, a wordline (wl) is driven by the wordline driving circuit 11, which is supplied directly using the first supply voltage Vdd. In other words, the wordline voltage swings between the first supply voltage Vdd and the second supply voltage Vss and therefore increases the stress on the SRAM memory cell 14 during a read operation. Both changes will cause memory cell 14 of the monitor cell 10 to fail earlier compared to regular array memory cells, in case aging or other environmental effects are present.

FIG. 4 shows a modified monitor cell 10' (as compared to FIG. 3), which is adapted to test for a reduced write-ability. Again, the monitor cell 10' consists of a regular memory cell 14, which is now directly driven using the first supply voltage Vdd. However, the wordline driving circuit 11 is deteriorated by using a second deterioration circuit 12' formed as diode-connected pFET device, for example, to reduce the voltage swing of the wordline (wl). This reduced voltage swing will not fully switch on the wordline devices 14.1 and 14.2 inside the memory cell 14 and therefore will make write operations to the memory cell 14 of the monitor cell 10 more difficult. Hence, it will fail earlier than the remaining regular memory array cells on the chip.

FIG. 5 shows a monitor cell 10", suitable for leakage sensing. Leakage that will occur on local bit-lines "blt" and "blc" that the SRAM memory cell 14 is connected to will cause read operations to fail. Using a third deterioration circuit 12" formed as diode-connected nFET device, for example, increases the low level of the wordline "wl" by one nFet threshold voltage Vthn. As a result, the wordline devices 14.1, 14.2 will not be fully switched off, causing additional leakage. Again, this deterioration will cause an early fail of the memory cell 14 of the monitor cell 10 compared to regular memory array cells.

Alternatively a deterioration circuit (not shown) is adapted to generate control signals con_sig with deteriorated timing parameters for the memory cell 14, which is part of the at least one monitor cell 10, 10', 10", compared to the regular memory cell.

Comparable deterioration circuits can be implemented for DRAM cells or for other memory cells, so the invention is not depending on the technology used for forming the memory cells.

Figure 6:
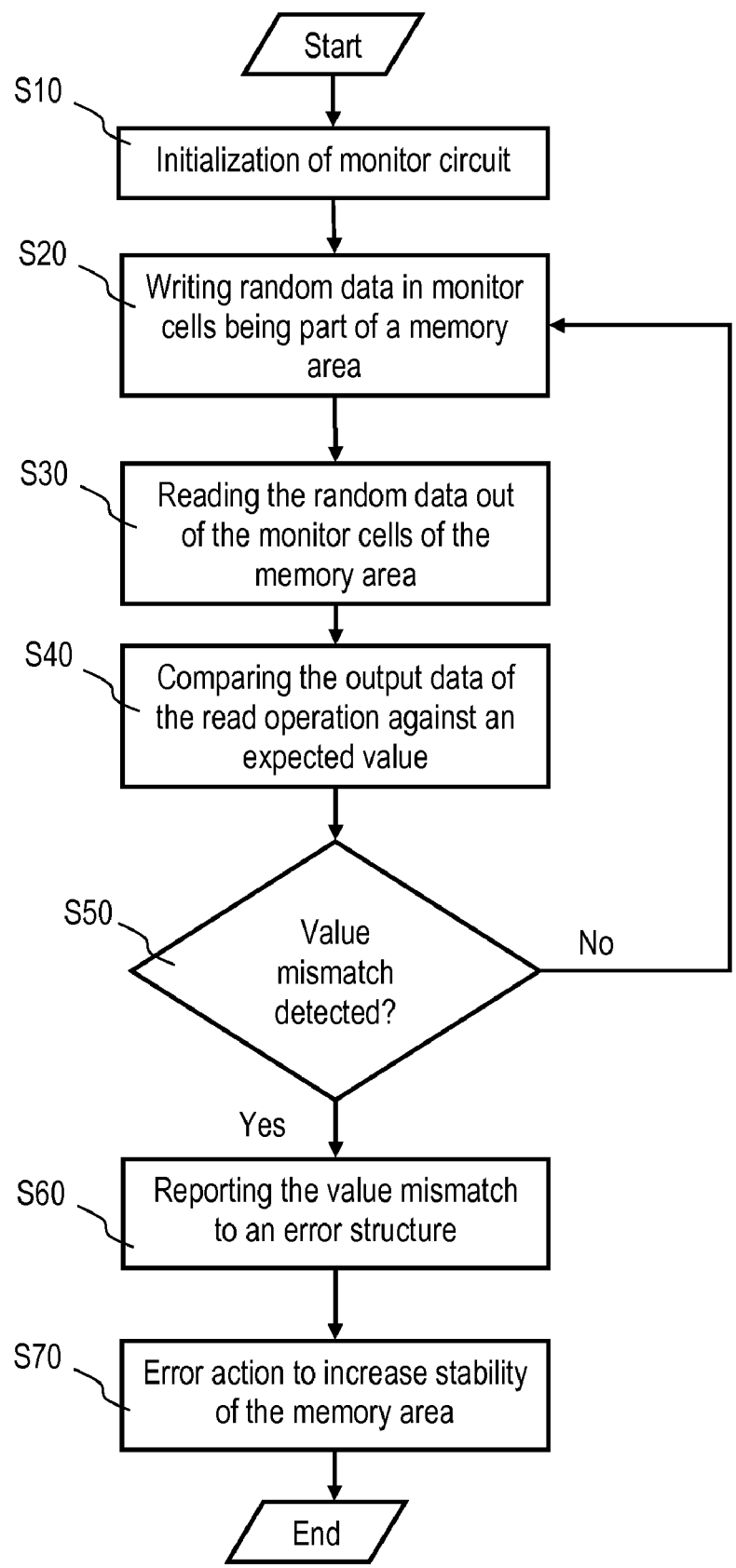
FIG. 6 is a schematic flow chart of a method for monitoring memory circuits, in accordance with an embodiment of the present invention.

FIG. 6 is a schematic flow chart of a method for monitoring memory circuits 5, in accordance with an embodiment of the present invention. Referring to FIG. 6, the flowchart depicts how the arrangement for monitoring memory circuits 5 will be used. After an initialization in step S10, the monitor circuit 20 will perform a writing process of random data in memory cell 14 of the monitor cell 10, 10', 10". In step S20 the random data is read out of memory cell 14 of the monitor cell 10, 10', and 10". In step S40 the data output of the read operation is compared with an expected value. In step S50 the method continuous with step S20 when no value mismatch is detected. If a value mismatch is detected, the error signal err_sig is propagated in step S60 into the error reporting structure 50 of the chip in order to allow software or other hardware devices to take appropriate action in step S70 with the goal to increase the stability of the memory circuit 5. Examples for such an action are an increase of the supply voltages Vdd, Vss, an increase of the DRAM-refresh rate, a change of certain SRAM-timing parameters, and a decrease of the operation temperature, for example.

Embodiments of the invention can be used for any chip that contains embedded memory such as microprocessors, or ASICs regardless of its application. The described functional features can be used for consumer applications as well as for high performance chips or any other application.

Embodiments of the invention can also be used for DRAM and SRAM chips that are used as main memory in state of the art computer systems. For this situation, an additional interface can be adapted to provide feedback of the status of the memory monitor circuits 20 to the memory controller/operating system 40 and to allow the memory controller/operating system 40 to take an appropriate action in order to increase the memory cell stability. The memory controller/operating system 40 changes at least one operating condition of the memory circuit 5 to increase the stability of the memory cells as a consequence of a detected value mismatch in at least one artificially deteriorated memory cell 14, which is part of the at least one monitor cell 10, 10', 10". The at least one operating condition comprises an operating voltage Vdd, Vss and/or an operating temperature and/or a refresh rate and/or timing parameters, for example.

Therefore embodiments of the invention comprise a circuit having a specific structural arrangement and a method to detect early stability problems in VLSI memory structures such as state of the art DRAM or SRAMs or any other memory technology. The idea of introducing artificially deteriorated memory cells for monitoring purpose is technology-independent.

The inventive method for monitoring memory circuits can be implemented as an entirely software embodiment, or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), and DVD. A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The invention claimed is:

1. A method for monitoring memory circuits used in integrated circuits, the method comprising:
   writing random data in at least one monitor cell, which is implemented as a regular memory cell with an artificially deteriorated stability in order to provoke early fails compared to fails of a regular memory cell, wherein random data is periodically written in said monitor cells and periodically read out from said monitor cells;
   reading said random data out of said at least one monitor cell;
   comparing output data retrieved by said reading of said random data against an expected value to detect a value mismatch, wherein said output data of said reading of random data is compared periodically against corresponding expected values to detect value mismatches; and
   reporting said value mismatch to an error structure if said value mismatch is detected.

2. The method according to claim 1, wherein said stability of a first monitor cell is deteriorated by using a reduced supply voltage (Vdd) compared to a supply voltage of regular memory cells.

3. The method according to claim 1, wherein said stability of a second monitor cell is deteriorated by using a higher wordline voltage swing compared to a wordline voltage swing of regular memory cells to increase stress on said second monitor cell.

4. The method according to claim 1, wherein said stability of a third monitor cell is deteriorated by using a lower wordline voltage swing compared to a wordline voltage swing of regular memory cells.

5. The method according to claim 1, wherein said stability of a fourth monitor cell is deteriorated by increasing a low level of said wordline voltage (Vss) compared to a next low level of said wordline voltage applied to regular memory cells.

6. The method according to claim 1, wherein said stability of a fifth monitor cell is deteriorated by using control signals (con_sig) with deteriorated timing parameters compared to the timing parameters of the con_sig of regular memory cells.

7. The method according to claim 1, wherein a predetermined number of said monitor cells is used to monitor said memory circuit.

8. The method according to claim 1, wherein at least one of said error reporting structure and a memory controller/operating system takes appropriate action to increase said stability of said memory cells.

9. The method of claim 8, wherein at least one operating condition of said memory circuit is changed to increase said memory cells stability as a consequence of a detected value mismatch in at least one artificially deteriorated monitor cell.

10. The method according to claim 9, wherein said at least one operating condition comprises one or more of an operating voltage (Vdd, Vss), an operating temperature, a refresh rate, and timing parameters.

11. A computer program product stored on a computer-usable device, comprising computer-readable program instructions for causing a computer to perform a method for monitoring memory circuits according to claim 1, when said program is run on said computer.

12. A system for monitoring memory circuits used in integrated circuits, the system comprising:
multiple memory cells and a monitor circuit; and
one or more monitoring cells;
wherein at least one monitor cell is implemented as a standard memory cell with an additional deterioration circuit, which artificially deteriorates a stability of the regular memory cell of the at least one monitor cell, compared to the stability of an actual regular memory cell in order to provoke early fails; and
wherein said monitor circuit generates random data which is periodically written in said monitor cells and read out from said monitor cells via a read operation, wherein said monitor circuit compares said output data of said read operation against said expected value to detect a value mismatch.

13. The system according to claim 12, wherein said deterioration circuit is adapted to reduce a supply voltage (Vdd, Vss) of said standard memory cell that is part of said at least one monitor cell, compared to the supply voltage of said regular memory cell.

14. The system according to claim 12, wherein said deterioration circuit is adapted to generate a higher wordline voltage swing for said standard memory cell that is a part of said at least one monitor cell, compared to the wordline voltage swing of said regular memory cell to increase stress on said memory cell, which is part of said at least one monitor cell.

15. The system according to claim 12, wherein said deterioration circuit is adapted to generate a lower wordline voltage swing for said standard memory cell that is part of said at least one monitor cell, compared to the wordline voltage swing of said regular memory cells.

16. The system according to claim 12, wherein said deterioration circuit is adapted to increase a low level of said wordline voltage for said standard memory cell, compared to a low level of said wordline voltage of said regular memory cell.

17. The system according to claim 12, wherein said deterioration circuit is adapted to generate control signals (con_sig) with deteriorated timing parameters for said standard memory cell that is part of said at least one monitor cell, compared to said timing parameters of the control signals of the regular memory cell.

18. The system according to claim 12, wherein said monitor circuit reports said value mismatch to one or more of: (a) an error structure and/or (b) a memory controller/operating system.

19. The system of claim 12, wherein one or more of the error structure and/or the memory controller/operating system changes at least one operating condition of said memory circuit to increase a stability of said memory cells as a consequence of a detected value mismatch in at least one artificially deteriorated monitor cell.

20. The system according to claim 19, wherein said at least one operating condition comprises one or more of: an operating voltage (Vdd, Vss); and an operating temperature; a refresh rate; and timing parameters.

21. An integrated circuit comprising multiple memory cells and a monitor circuit and configured according to claim 12.

22. The integrated circuit according to claim 21, wherein said multiple memory cells are part of an embedded memory circuit used in a microprocessor and/or an ASIC.

23. The integrated circuit according to claim 21, wherein:
said multiple memory cells are part of a DRAM and/or SRAM chip; and
said DRAM and/or SRAM chip are used as main memory in a computer system.

* * * * *